United States Patent [19]

Nakashiba

[11] Patent Number: 5,441,910
[45] Date of Patent: Aug. 15, 1995

[54] METHOD FOR MANUFACTURING CCD TYPE SOLID IMAGE PICKUP DEVICE USING SELF-ALIGNMENT PROCESS

[75] Inventor: Yasutaka Nakashiba, Tokyo, Japan
[73] Assignee: NEC Corporation, Tokyo, Japan
[21] Appl. No.: 101,315
[22] Filed: Aug. 3, 1993
[30] Foreign Application Priority Data
  Aug. 3, 1992 [JP] Japan .................. 4-206365
[51] Int. Cl.$^6$ .................. H01L 21/265; H01L 21/70; H01L 27/00
[52] U.S. Cl. ........................ 437/53; 437/35; 437/50
[58] Field of Search ........... 437/50, 53, 35, 69, 437/924, 984; 257/216, 219, 221, 247, 344, 377, 408

[56] References Cited

U.S. PATENT DOCUMENTS

| | | | |
|---|---|---|---|
| 3,914,857 | 10/1975 | Goser et al. | 437/50 |
| 4,984,047 | 1/1991 | Stevens | 357/30 |
| 5,002,896 | 3/1991 | Naruke | 437/50 |
| 5,132,241 | 7/1992 | Su | 437/69 |
| 5,288,656 | 2/1994 | Kusaka et al. | 437/50 |

OTHER PUBLICATIONS

I. Stanley Wolf and Richard Tauber, Silicon Processing for the VLSI Era 219-220 (1986).
M. F. Tompsett et al, "Charge-Coupled Imaging Device: Experimental Results", IEEE Trans. of Electron Devices, vol. ED-18, No. 11, Nov. 1971, pp. 992-996.
W. F. Kosonocky et al, "Two-Phase Charge-Coupled Devices with Overlapping Polysilicon and Alumium Gates", RCA Review, vol. 34, Mar. 1973, pp. 164-202.

*Primary Examiner*—Olik Chaudhuri
*Assistant Examiner*—Brian K. Dutton
*Attorney, Agent, or Firm*—Sughrue, Mion, Zinn, Macpeak & Seas

[57] ABSTRACT

An impurity doped region for a vertical transfer portion is formed by using a first mask pattern layer. An impurity doped region for a horizontal transfer portion is formed by using a second mask pattern layer which is formed by using the first mask pattern layer.

24 Claims, 18 Drawing Sheets

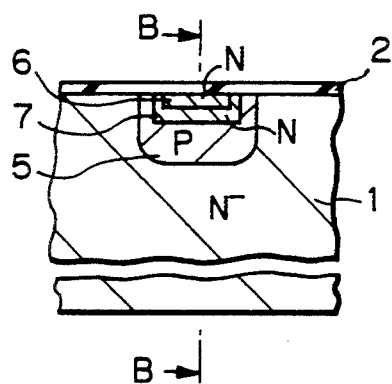
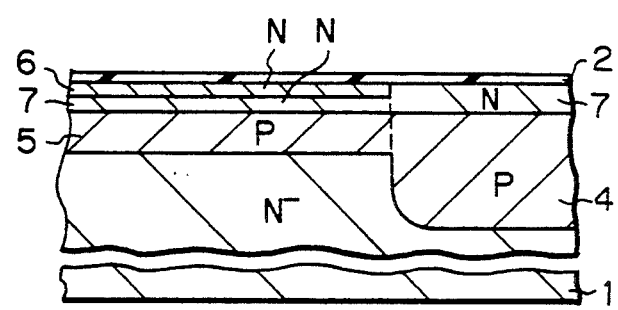
Fig. 8A PRIOR ART
Fig. 8B PRIOR ART
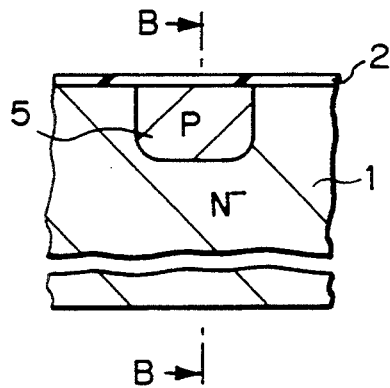
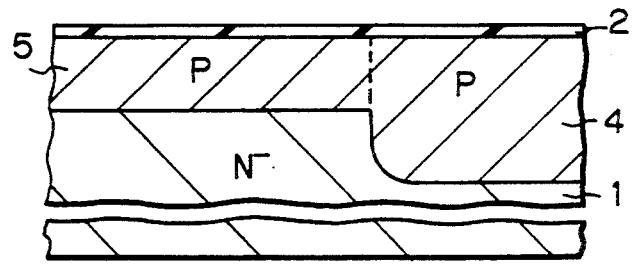
Fig. 9A PRIOR ART
Fig. 9B PRIOR ART

METHOD FOR MANUFACTURING CCD TYPE SOLID IMAGE PICKUP DEVICE USING SELF-ALIGNMENT PROCESS

BACKGROUND OF THE INVENTION

1. Field of the Invention

The present invention relates to a charge coupled device (CCD) type solid state image pickup device, and more particularly, to a method for manufacturing such a device having at least one vertical transfer portion and a horizontal transfer portion.

2. Description of the Related Art

A prior art CCD type solid state image pickup device includes a plurality of photo/electro conversion portions, a plurality of vertical transfer portions connected to the photo/electro conversion portions, a horizontal transfer portion connected to the vertical transfer portions, and an output portion. Also, there are two kinds of CCD's: a surface channel CCD(SCCD) where a signal charge is transferred along a surface of a semiconductor substrate, and a buried channel CCD(BCCD) where a signal charge is transferred within a semiconductor substrate.

An example of a SCCD is formed by an N-type semiconductor substrate, a P-type inpurity doped region formed within the semiconductor substrate, and a silicon dioxide layer formed on the P-type impurity region, thereby transferring a signal charge along a surface between the silicon dioxide layer and the P-type impurity doped region. On the other hand, an example of a BCCD is formed by an N-type semiconductor substrate, a P-type inpurity doped region formed within the semiconductor substrate, a N-type impurity doped region formed within the P-type impurity region and a silicon dioxide layer formed on the N-type impurity doped region, thereby transferring a signal charge along a depletion region between the N-type impurity doped region and the P-type impurity doped region.

Incidentally, in a prior art BCCD type solid state image pickup device for a high definition television (HDTV) system and a movie system, as the number of elements has been remarkably increased and the size of the device has been remarkably reduced, the size of the vertical transfer portions has been reduced. As a result, in the vertical transfer portions, a junction between the N-type impurity doped region and the P-type impurity doped is more shallow, to thereby enhance the ability to transfer charges per unit area. On the other hand, in the horizontal transfer portion, a junction between the N-type impurity doped region and the P-type impurity doped region is deepened to enhance the fringe electric field to thereby compensate for the efficiency of transfer of charges deteriorated by the enhanced ability of transfer of charges of the vertical transfer portions. That is, the impurity doped region for the vertical transfer portion has a different concentration distribution from the corresponding impurity doped region for the horizontal transfer portion. The same is true for the SCCD.

In a prior art method for manufacturing a CCD type solid state image pickup device having two impurity doped regions for a vertical transfer portion and a horizontal transfer portion, these regions having different concentration distributions from each other, the two impurity doped regions are manufactured independently, which will be later explained in detail. As a result, if the two impurity doped regions are largely superposed onto each other, a potential barrier may occur under a charge transfer electrode. Or if the two impurity doped regions are slightly superposed onto each other or are separated from each other, a deep potential well may occur under the charge transfer electrode. Both cases prevent a smooth transfer of charges from the vertical portion to the horizontal portion.

SUMMARY OF THE INVENTION

It is an object of the present invention to enable smooth transfer of charges from a vertical transfer portion to a horizontal transfer portion in a CCD type solid state image device having an impurity doped region for the vertical transfer portion and an impurity doped region for the horizontal transfer portion, the impurity doped regions having different concentration distributions from each other.

According to the present invention, an impurity doped region for the vertical transfer portion is formed by using a first mask pattern layer. An impurity doped region for the horizontal transfer portion is formed by using a second mask pattern layer which is formed by using the first mask pattern layer. That is, one of the two impurity doped regions is in self-alignment with the other.

BRIEF DESCRIPTION OF THE DRAWINGS

The present invention will be more clearly understood from the description as set forth below, compared with the prior art, with reference to the accompanying drawings, wherein:

FIGS. 4A, 4B, 5A, 5B, 6A, 6B, 7A, 7B, 8A, 8B, 9A and 9B are cross-sectional views explaining a prior art method for manufacturing a CCD type solid state image pickup device;

DESCRIPTION OF THE PREFERRED EMBODIMENTS

Before the description of embodiments of the present invention, a prior art CCD type solid state image pickup device will be explained with reference to FIGS. 1, 2, 3, 4A, 4B, 5A, 5B, 6A, 6B, 7A, 7B, 8A, 8B, 9A, 9B, 10 and 11.

Figure 1:
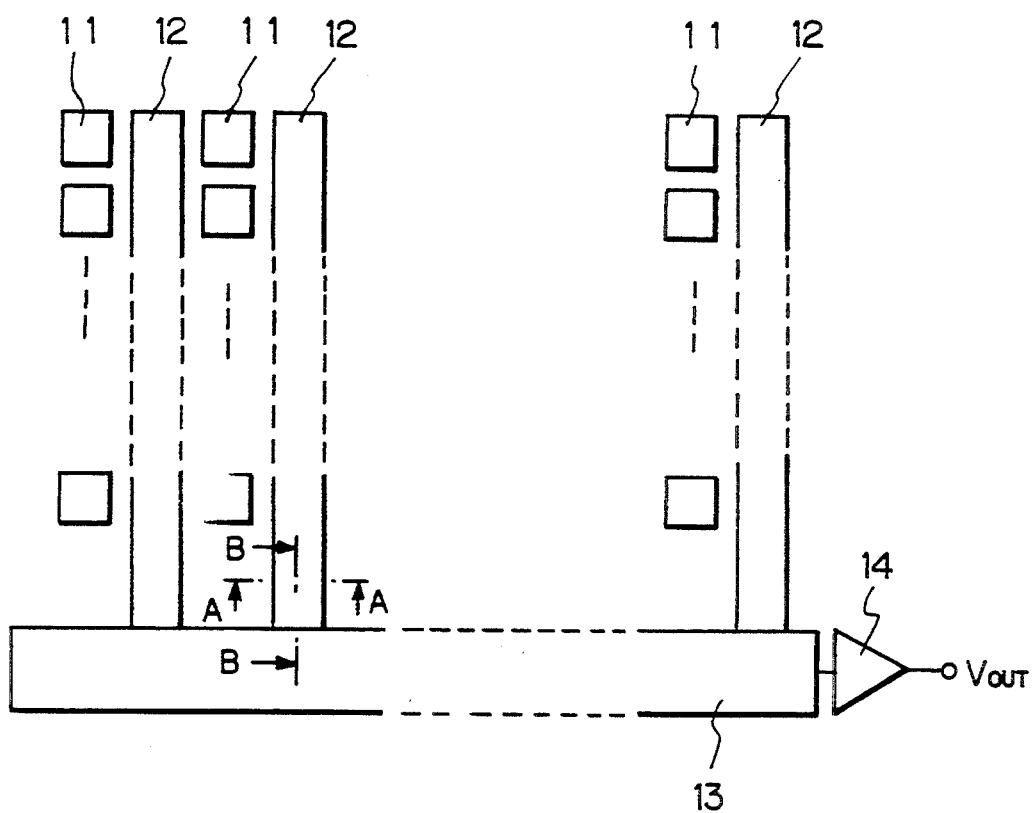
FIG. 1 is a diagram illustrating a prior art CCD type solid state image pickup device.

In FIG. 1, which illustrates a prior art CCD type solid state image pickup device, light is incident to two-dimensionally arranged photo/electro conversion portions 11, and as a result, signal charges obtained by the photo/electro conversions are transferred to vertical transfer portions 12. The signal charges are further transferred via a horizontal transfer portion 13 to an output portion 14.

Figure 2:
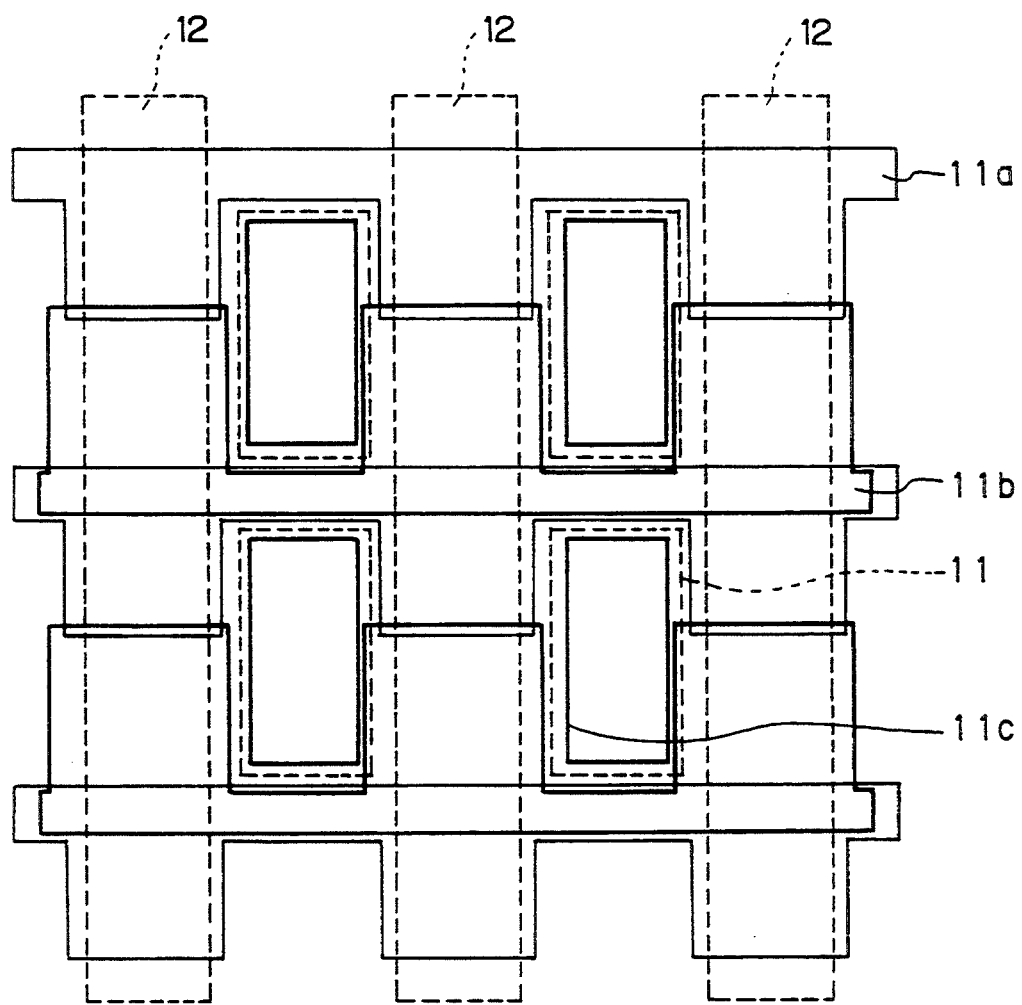
FIG. 2 is a plan view of the photo/electro conversion portions and the vertical transfer portions of FIG. 1.

Also, as illustrated in FIG. 2, the photo/electro conversion portions 11 are surrounded by two conductive layers 11a and 11b and receive light via openings 11c.

Figure 3:
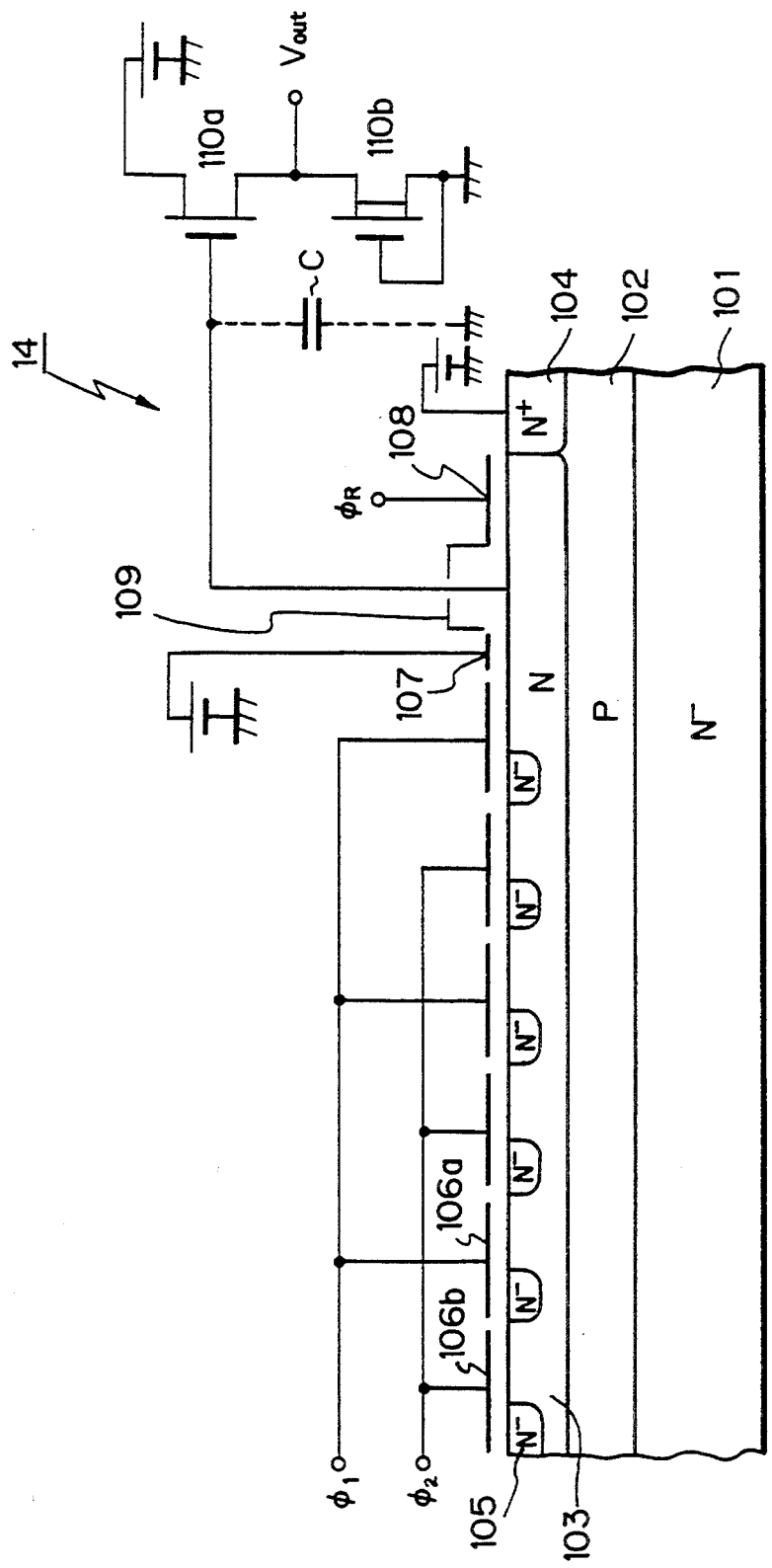
FIG. 3 is a diagram of the output portion of FIG. 1.

Further, as illustrated in FIG. 3, the output portion 14 is formed by a floating diffusion amplifier. That is, in FIG. 3, a P-type well 102 is formed on a semiconductor substrate 101, to avoid a punchthrough of an N+-type semiconductor region 104. The P-type well 102 serves as a charge transfer portion and forms a floating diffusion region portion 109. Also, reference numeral 104 designates an N+-type semiconductor region for receiving a reset potential. Further, formed in the N-type semiconductor region 103 are N−-type semiconductor regions 105. Further, charge transfer electrodes 106a and 106b, an output gate electrode 107 and a reset gate electrode 108 made of polycrystalline silicon are formed via a gate insulating layer (not shown) thereon. Also, reference numerals 110a and 110b are MOS transistors forming a source follower.

In FIG. 3, when a reset clock signal $\phi_R$ is applied to the reset gate electrode 108, the potential at the floating diffusion portion 109 is the same as the reset potential. Thereafter, the reset gate electrode 108 is turned OFF to prepare for detection of a signal charge. Next, when transfer clock signals $\phi_1$ and $\phi_2$ opposite in phase to each other are applied to the charge transfer electrodes 106a and 106b, the signal charge is transferred to the output gate electrode 107 and the floating diffusion portion 109. Then, an impedance transformation is performed upon the transferred signal charge at the source follower (110a, 110b), thus generating an output voltage $V_{out}$. In this case, $$V_{out} = Q/C \cdot G$$

where
Q is the signal charge;
C is a capacity of the floating diffusion portion 109; and
G is a voltage gain of the source follower (110a, 110b).

The above-mentioned process is repeated to sequentially generate signal charges as the output voltage $V_{out}$.

Next, a prior art method for manufacturing a CCD type solid state image pickup device will be explained with reference to FIGS. 4A, 4B, 5A, 5B, 6A, 6B, 7A, 7B, 8A, 8B, 9A and 9B showing a connection portion between a vertical transfer portion and a horizontal transfer portion. Note that FIGS. 4A through 9A are cross-sectional views taken along the line A—A in FIG. 1, and FIGS. 4B through 9B are cross-sectional views taken along the line B—B in FIG. 1 and also along the line B—B in FIGS. 4A through 9A, respectively.

Figure 4A:
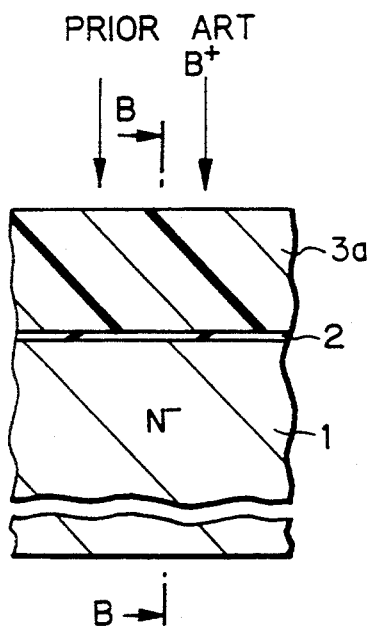
Figure 4B:
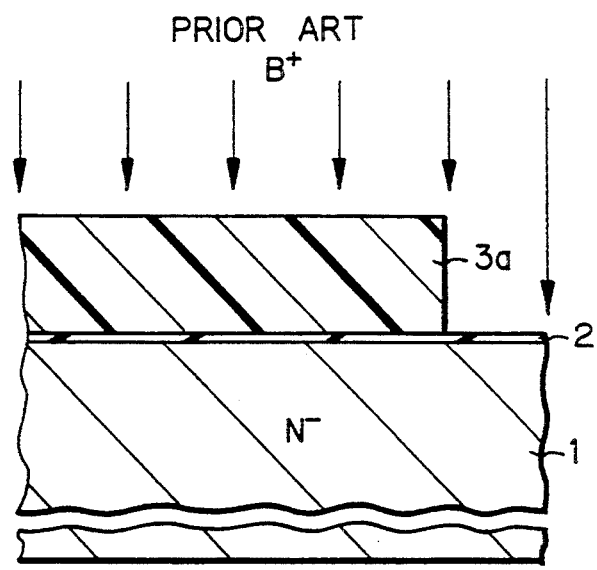

First, as illustrated in FIGS. 4A and 4B, a silicon dioxide layer 2 having a thickness of about 50 nm is grown by thermally oxidizing an N-type monocrystalline silicon substrate 1. Then, a photoresist layer 3a having a thickness of about 1.0 μm is coated thereon, and is patterned by conventional photolithography. Then, $1.0 \times 10^{12}$ boron ions (B+) per square cm at 100 keV are implanted at the incident angle 0° with a mask of the patterned photoresist layer 3a. Then, the photoresist layer 3a is removed.

Figure 5A:
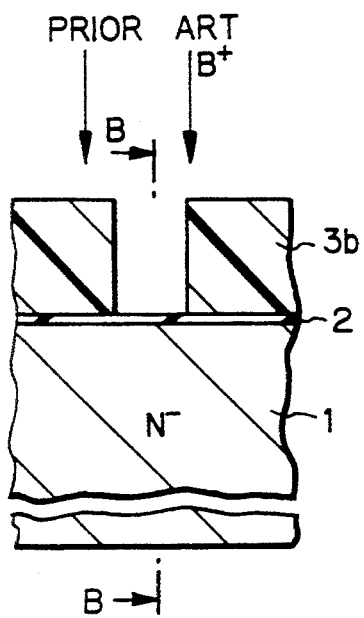
Figure 5B:
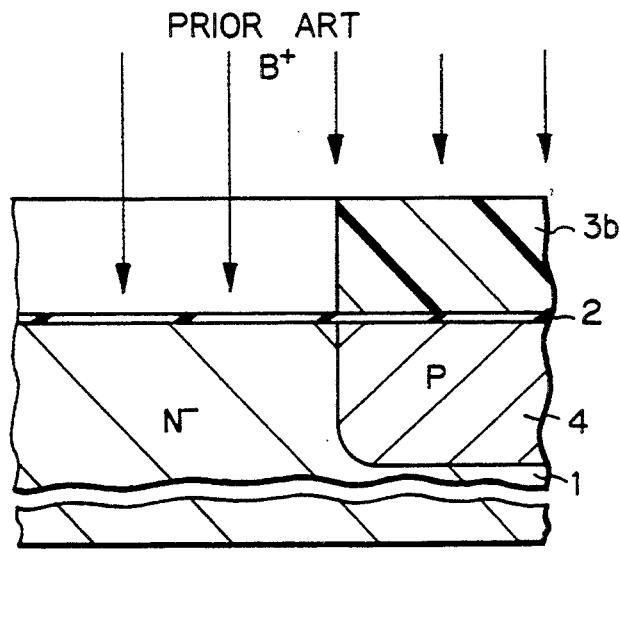

Next, as illustrated in FIGS. 5A and 5B, a heat operation such as 1200° C.×5 hours is carried out to create a P-type well (impurity doped region) 4 within the silicon substrate 1. The P-type well 4 serves as a part of a horizontal transfer portion. Again, a photoresist layer 3b having a thickness of about 1.0 μm is coated thereon, and is patterned by the conventional photolithography. Then, $3.0 \times 10^{12}$ boron ions (B+) per square cm at 60 keV are implanted at the incident angle 0° with a mask of the patterned photoresist layer 3b. Then, the photoresist layer 3b is removed.

Figure 6A:
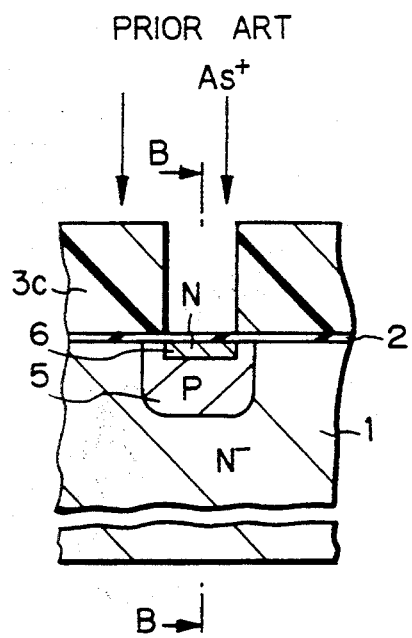
Figure 6B:
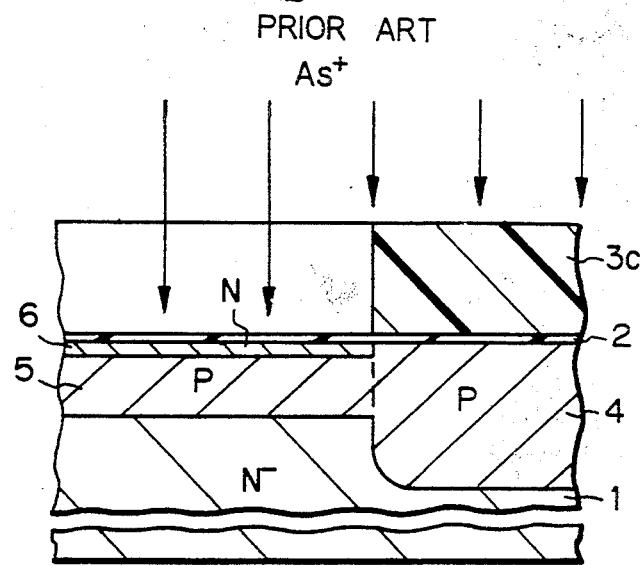

Next, as illustrated in FIGS. 6A and 6B, a heating operation such as 1100° C.×2 hours is carried out to create a P-type well (impurity doped region) 5 within the silicon substrate 1. The P-type well 5 serves as a part of a vertical transfer portion. Then, a photoresist layer 3c having a thickness of about 1.0 μm is coated thereon, and is patterned by conventional photolithography. Then, $2.0 \times 10^{12}$ arsenic ions (As+) per square cm at 150 keV are implanted at the incident angle 0° with a mask of the patterned photoresist layer 3c. Then, the photoresist layer 3c is removed. In this state, an annealling (or heating) operation can be carried out as occasion demands. Thus, formed within the P-type well 5 is an N-type impurity doped region 6 which serves as a part of the vertical transfer portion.

Figure 7A:
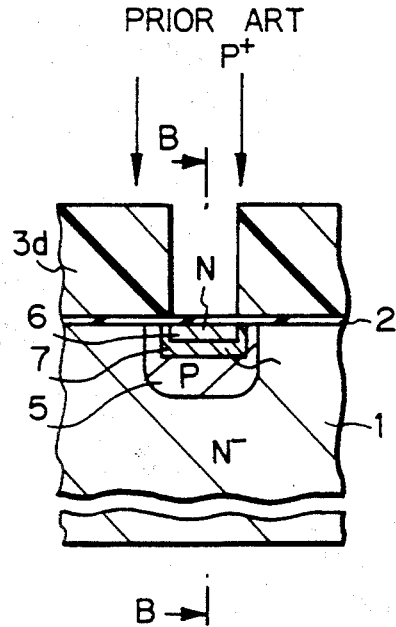
Figure 7B:
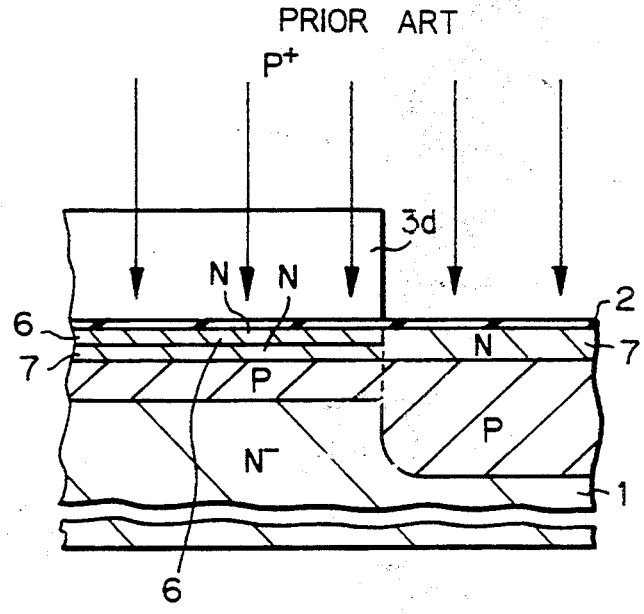
Figure 10:
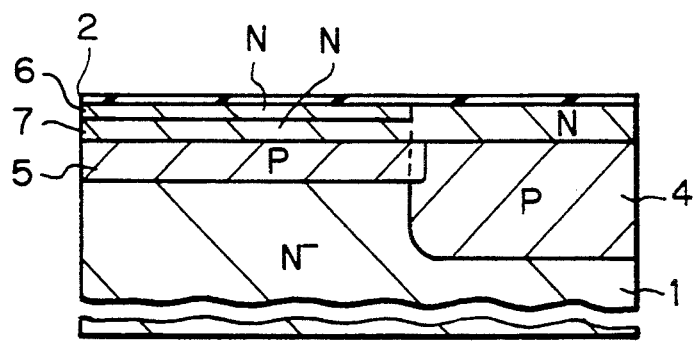
FIGS. 10 and 11 are cross-sectional views explaining the disadvantages of the prior art method of FIGS. 4A, 4B, 5A, 5B, 6A, 6B, 7A, 7B, 8A, 8B, 9A, and 9B.
Figure 10:
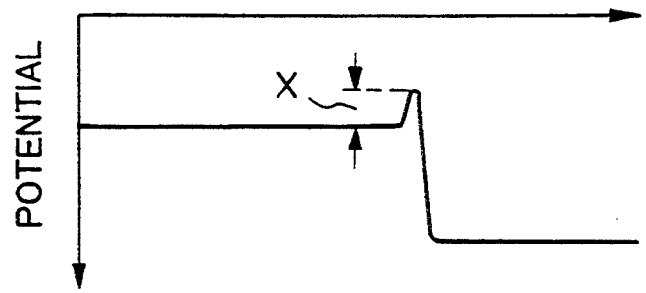
Figure 11:
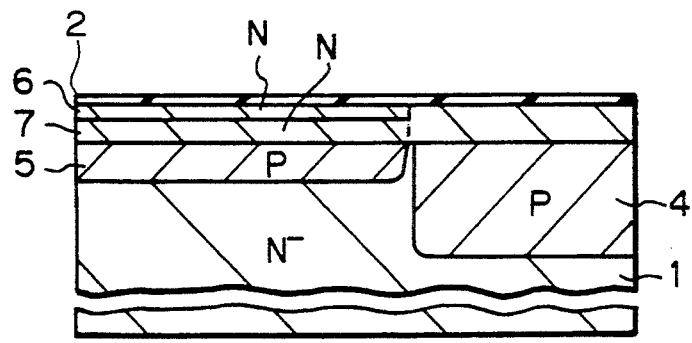
Figure 11:
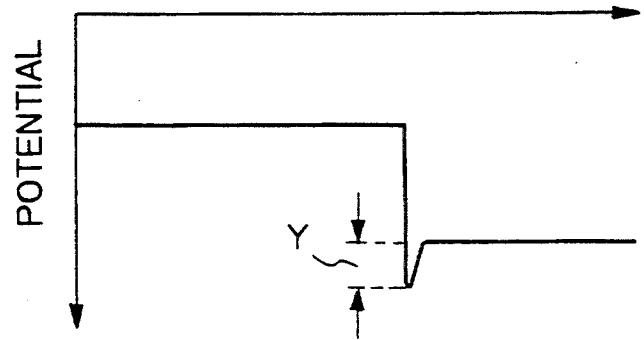

Next, as illustrated in FIGS. 7A and 7B, a photoresist layer 3d having a thickness of about 1.0 μm is coated thereon, and is patterned by conventional photolithography. Then, $2.0 \times 10^{12}$ phosphorus ions (P+) per square cm at 150 keV are implanted at the incident angle 0° with a mask of the patterned photoresist layer 3d. In this state, an annealling (or heating) operation can be carried out as occasion demands. Thus, formed within the P-type wells 4 and 5 is an N-type impurity doped region 7 which serves as a part of the horizontal transfer portion and a part of the vertical transfer portion.

Then, the photoresist layer 3d is removed to obtain a BCCD type solid state image pickup device as illustrated in FIGS. 8A and 8B. Note that, when manufacturing a SCCD type solid state image pickup device, the manufacturing steps for the N-type impurity doped regions 6 and 7 are unnecessary, in other words, the manufacturing steps after the formation of the P-type well 5 are unnecessary, and therefore, an SCCD type solid state image pickup device is obtained as illustrated in FIGS. 9A and 9B.

Thus, the prior art CCD type solid state image pickup device of FIGS. 8A and 8B or FIGS. 9A and 9B are completed by forming electrodes and conductive layers for the photo/electro conversion portions, the charge transfer portion, and the light incident openings (see: FIGS. 2 and 3).

In the above-mentioned prior art CCD type solid state image pickup device, however, the P-typewells (impurity doped regions) 4 and 5 for the horizontal transfer portion and the vertical transfer portion are formed independently, i.e., in accordance with the two different photolithography steps using the photoresist layers 3a and 3b, and also, the impurity doped regions 6 and 7 for the vertical transfer portion and the horizontal transfer portion are formed independently, i.e., in accordance with the two different photolithography steps using the photoresist layers 3c and 3d, the above-mentioned problems may occur. For example, in a BCCD type solid state image pickup device, if the two impurity doped regions 4 and 5 are largely superposed onto each other, a potential barrier as indicated by an arrow X in FIG. 10 may occur under a charge transfer electrode. Or if the two impurity doped regions 4 and 5 are slightly superposed onto each other or are separated from each other a deep potential well as indicated by an arrow Y in FIG. 11 may occur under the charge transfer electrode. Both cases prevent a smooth transfer of charges from the vertical portion to the horizontal portion.

Next, a first embodiment of the method for manufacturing a CCD type solid state image pickup device according to the present invention will be explained with reference to FIGS. 12A, 12B, 13A, 13B, 14A, 14B, 15A, 15B, 16A, 16B, 17A and 17B, which correspond to FIGS. 4A, 4B, 5A, 5B, 6A, 6B, 7A, 7B, 8A, 8B, 9A and 9B, respectively.

Figure 12A:
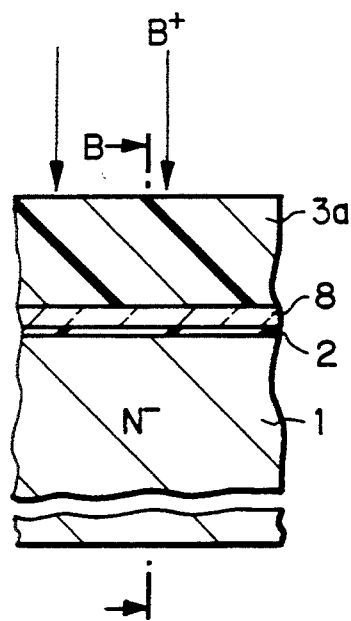
FIGS. 12A, 12B, 13A, 13B, 14A, 14B, 15A, 15B, 16A, 16B, 17A and 17B are cross-sectional views explaining a first embodiment of the method for manufacturing a CCD type solid state image pickup device according to the present invention.
Figure 12B:
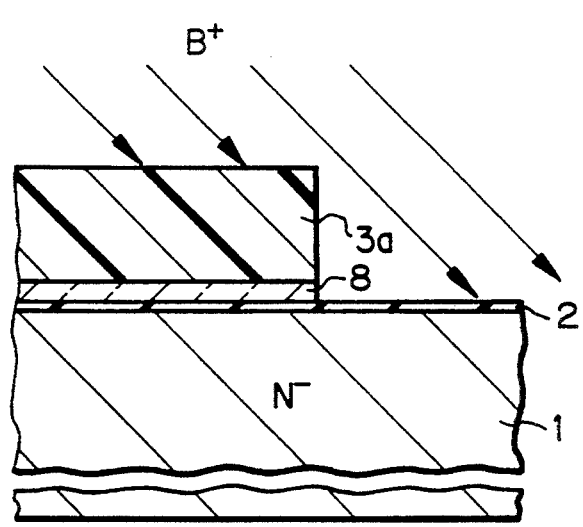

First, as illustrated in FIGS. 12A and 12B, a silicon dioxide layer 2 having a thickness of about 50 nm is grown by thermally oxidizing a N$^-$-type monocrystalline silicon substrate 1. Then, a thick silicon nitride layer 8 having a thickness of about 250 nm is deposited by a chemical vapor deposition (CVD) process on the silicon dioxide layer 2, and a photoresist layer 3a having a thickness of about 1.0 μm is coated thereon. Next, the photoresist layer 3a is patterned by conventional photolithography, and the silicon nitride layer 8 is patterned by a plasma etching process. Then, $1.0 \times 10^{12}$ boron ions (B$^+$) per square cm at 100 keV are implanted at the incident angle 60° with a mask of the patterned photoresist layer 3a and the silicon nitride layer 8. Then, the photoresist layer 3a is removed.

Figure 13A:
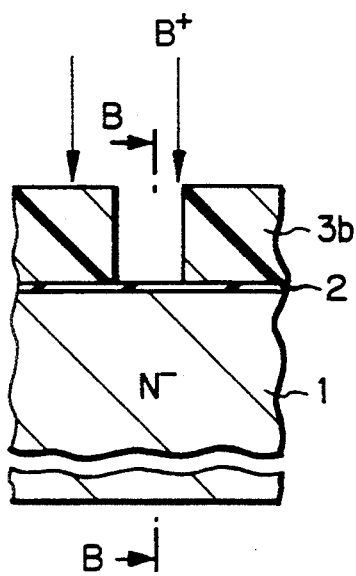
Figure 13B:
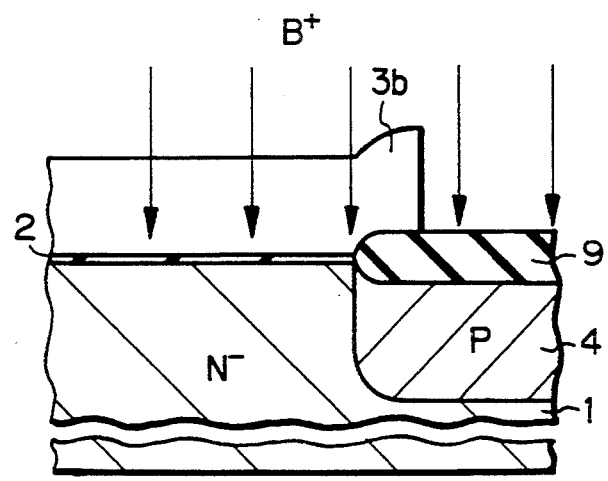

Next, as illustrated in FIG. 13A and 13B, a heating operation such as 1200° C.×5 hours is carried out to create a P-type well (impurity doped region) 4 within the silicon substrate 1. The P-type well 4 serves as a part of a horizontal transfer portion. Note that the inclination of the incident angle (such as 60°) of the boron ions is helpful in the adjustment of the P-type well configuration enlarged by this heating operation. Next, a selective oxidization is carried out with a mask of the patterned silicon nitride 8, to grow a thick silicon dioxide layer 9 having a thickness of about 400 nm on the P-type well 4. Then, the silicon nitride layer 8 is removed by a wet etching process. Again, a photoresist layer 3b having a thickness of about 1.0 μm is coated thereon, and is patterned by conventional photolithography. In this case, note that the patterned photoresist layer 3b does not cover the horizontal transfer portion and the vertical transfer portion. Then, $3.0 \times 10^{12}$ boron ions (B$^+$) per square cm at 60 keV are implanted at the incident angle 0° with a mask of the patterned photoresist layer 3b. Then, the photoresist layer 3b is removed.

Figure 14A:
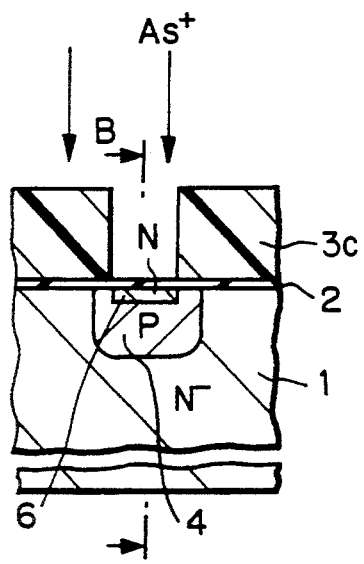
Figure 14B:
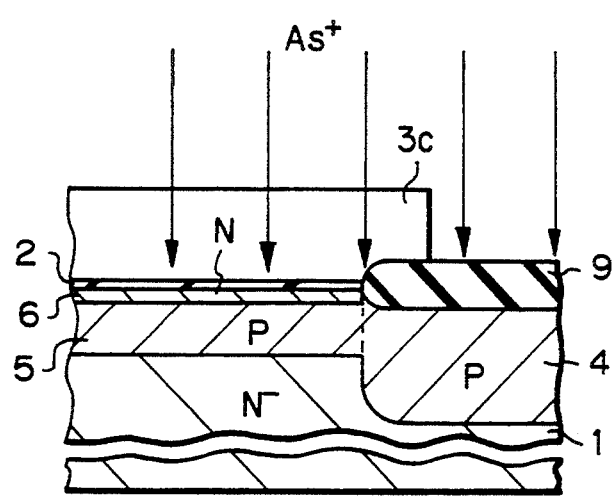

Next, as illustrated in FIGS. 14A and 14B, a heating operation such as 1100° C.×2 hours is carried out to create a P-type well (impurity doped region) 5 within the silicon substrate 1. The P-type well 5 serves as a part of the vertical transfer portion. Thus, the P-type well 5 for the vertical transfer portion is in self-alignment with the P-type well 4 for the horizontal transfer portion. Then, a photoresist layer 3c is having a thickness of about 1.0 μm is coated thereon, and is patterned by conventional photolithography. Also, in this case, the patterned photoresist layer 3c does not cover the horizontal transfer portion and the vertical transfer portion. Then, $2.0 \times 10^{12}$ arsenic ions (A$_s^+$) per square cm at 150 keV are implanted at the incident angle 0° with a mask of the patterned photoresist layer 3c and the thick silicon dioxide layer 9. Then, the photoresist layer 3c is removed. In this state, an annealling (or heating) operation can be carried out as occasion demands. Thus, formed within the P-type wells 5 is an N-type impurity doped region 6 which serves as a part of the vertical transfer portion. In this case, the N-type impurity doped region 6 is in self-alignment with the P-type well 5 for the vertical transfer portion and the P-type well 4 for the horizontal transfer portion.

Figure 15A:
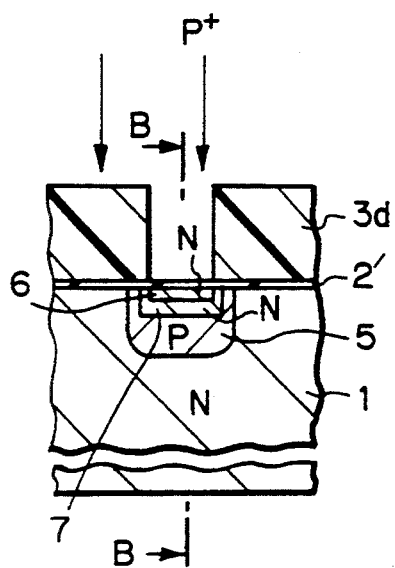
Figure 15B:
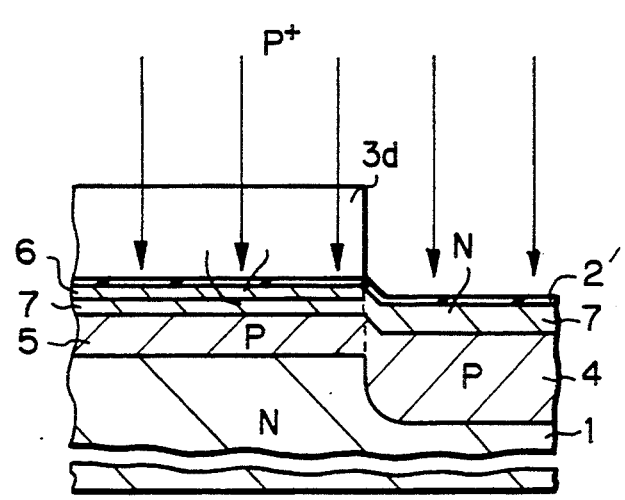

Next, as illustrated in FIGS. 15A and 15B, the silicon dioxide layer 2 and the thick silicon dioxide layer 9 are both removed by an etching process. Then, the silicon substrate 1 is again thermally oxidized to grow a silicon dioxide layer 2' having a thickness of about 20 nm. Again, a photoresist layer 3d having a thickness of about 1.0 μm is coated thereon, and is patterned by the conventional photolithography. Also, in this case, the patterned photoresist layer 3d does not cover the horizontal transfer portion and the vertical transfer portion. Then, $2.0 \times 10^{12}$ phosphorus ions (P$^+$) per square cm at 150 keV are implanted at the incident angle 0° with a mask of the patterned photoresist layer 3d. In this state, an annealling (or heating) operation can be carried out as occasion demands. Thus, formed within the P-type wells 4 and 5 is an N-type impurity doped region 7 which serves as a part of the horizontal transfer portion and a part of the vertical transfer portion.

Figure 16A:
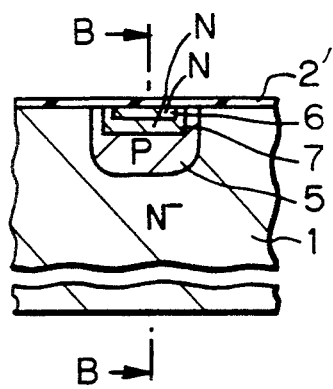
Figure 16B:
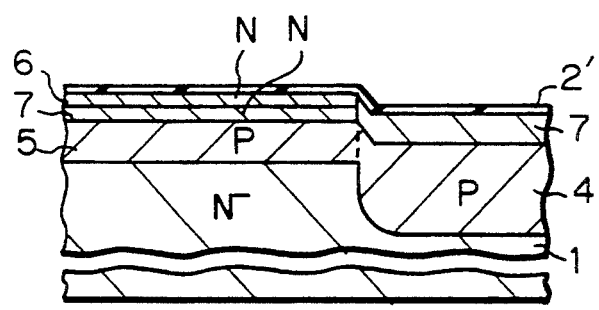
Figure 17A:
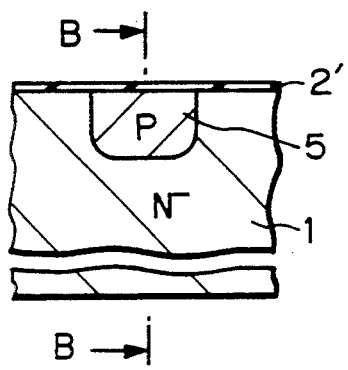
Figure 17B:
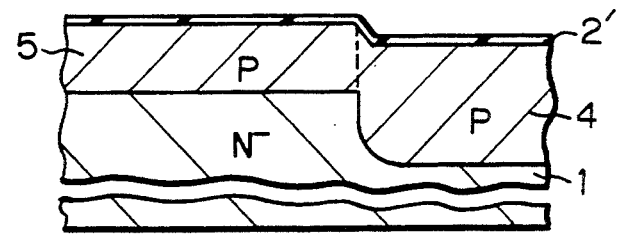

Then, the photoresist layer 3d is removed to obtain a BCCD type solid state image pickup device as illustrated in FIGS. 16A and 16B. Also, note that, when manufacturing an SCCD type solid state image pickup device, the manufacturing steps for the N-type impurity doped regions 6 and 7 are unnecessary, in other words, the manufacturing steps after the formation of the P-type well 5 are unnecessary, and therefore, a SCCD type solid state image pickup device is obtained as illustrated in FIGS. 17A and 17B.

Thus, the CCD type solid state image pickup device of FIGS. 16A and 16B or FIGS. 17A and 17B is completed by forming electrodes and conductive layers for the photo/electro conversion portions, the charge transfer portion, and the light incident openings (see FIGS. 2 and 3).

In the above-mentioned first embodiment of the present invention, since the connection portion between the vertical transfer portion and the horizontal transfer portion is formed so that these two portions are in self alignment with each other, the potential well and potential barrier (see FIGS. 10 and 11) generated by the misalignment of the masks in this connection portion can be avoided, thus effectively enabling a transfer of signal charges from the vertical transfer portion to the horizontal transfer portion.

Next, a second embodiment of the method for manufacturing a CCD type solid state image pickup device according to the present invention will be explained with reference to FIGS. 18A, 18B, 19A, 19B, 20A, 20B, 21A, 21B, which correspond to FIGS. 12A, 12B, 13A, 13B, 14A, 14B, 15A and 15B, respectively.

Figure 18A:
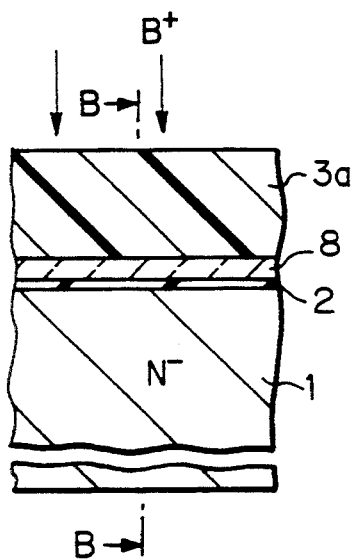
FIGS. 18A, 18B, 19A, 19B, 20A, 20B, 21A and 21B are cross-sectional views explaining a second embodiment of the method for manufacturing a CCD type solid state image pickup device according to the present invention.
Figure 18B:
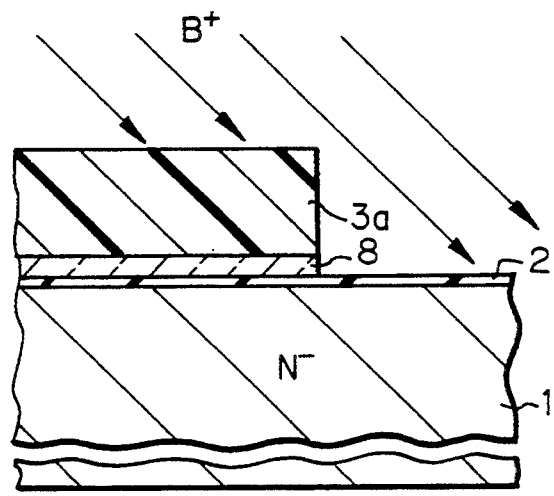

First, as illustrated in FIGS. 18A and 18B, a silicon dioxide layer 2 having a thickness of about 50 nm is grown by thermally oxidizing a N$^-$-type monocrystalline silicon substrate 1. Then, a thick silicon nitride layer 8 having a thickness of about 250 nm is deposited by a CVD process on the silicon dioxide layer 2, and a photoresist layer 3a having a thickness of about 1.0 μm is coated thereon. Next, the photoresist layer 3a is patterned by conventional photolithography, and the silicon nitride layer 8 is patterned by the plasma etching process. Then, $1.0 \times 10^{12}$ boron ions (B$^+$) per square cm at 100 keV are implanted at the incident angle 60° with a mask of the patterned photoresist layer 3a and the silicon nitride layer 8. Then, the photoresist layer 3a is removed.

Figure 19A:
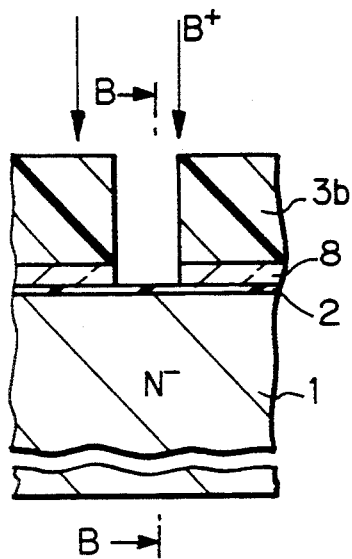
Figure 19B:
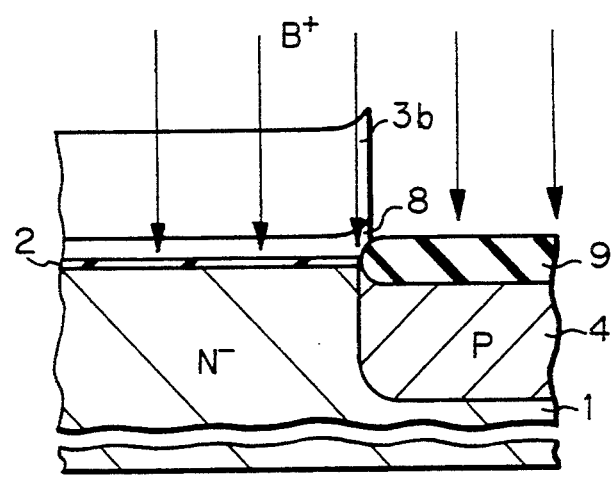

Next, as illustrated in FIGS. 19A and 19B, a heating operation such as 1200° C.×5 hours is carried out to create a P-type well (impurity doped region) 4 within the silicon substrate 1. The P-type well 4 serves as a part of a horizontal transfer portion. Also, in this case, note that the inclination of the incident angle (such as 60°) of the boron ions is helpful in the adjustment of the P-type well configuration enlarged by this heating operation. Next, a selective oxidization is carried out with a mask of the patterned silicon nitride 8, to grow a thick silicon dioxide layer 9 having a thickness of about 400 nm on the P-type well 4. Again, a photoresist layer 3b having a thickness of about 1.0 μm is coated thereon, and is patterned by conventional photolithography. Then, the silicon nitride layer 8 is selectively removed by a photolithography process with a mask of the photoresist layer 3b. In this case, note that the patterned photoresist layer 3b, i.e., the patterned silicon nitride layer 8 does not cover the horizontal transfer portion and the vertical transfer portion. Then, $3.0 \times 10^{12}$ boron ions (B$^+$) per square cm at 60 keV are implanted at the incident angle 0° with a mask of the patterned photoresist layer 3b and the patterned silicon nitride layer 8. Then, the photoresist layer 3b is removed.

Figure 20A:
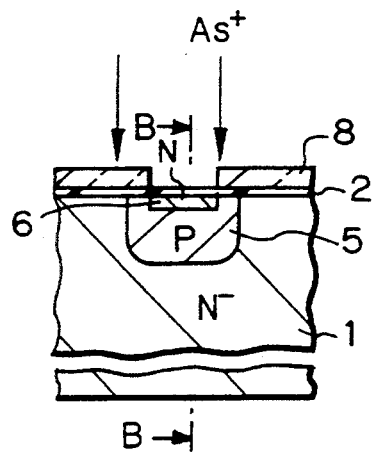
Figure 20B:
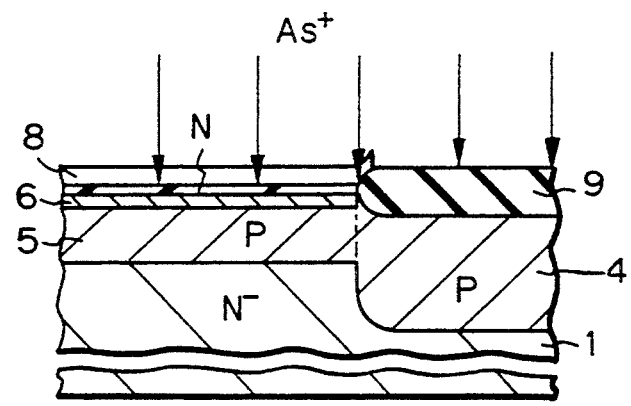

Next, as illustrated in FIG. 20A and 20B, a heating operation such as 1100° C.×2 hours is carried out to create a P-type well (impurity doped region) 5 within the silicon substrate 1. The P-type well 5 serves as a part of a vertical transfer portion. Thus, the P-type well 5 for the vertical transfer portion is in self-alignment with the P-type well 4 for the horizontal transfer portion. Then, $2.0 \times 10^{12}$ arsenic ions (A$_s^+$) per square cm at 150 keV are implanted at the incident angle 0° with a mask of the patterned silicon nitride layer 8 and the thick silicon dioxide layer 9. In this state, an annealling (or heating) operation can be carried out as occasion demands. Thus, formed within the P-type wells 5 is an N-type impurity doped region 6 which serves as a part of the vertical transfer portion. In this case, the N-type impurity doped region 6 is in with the P-type well 5 for the vertical transfer portion and the P-type well 4 for the horizontal transfer portion.

Figure 21A:
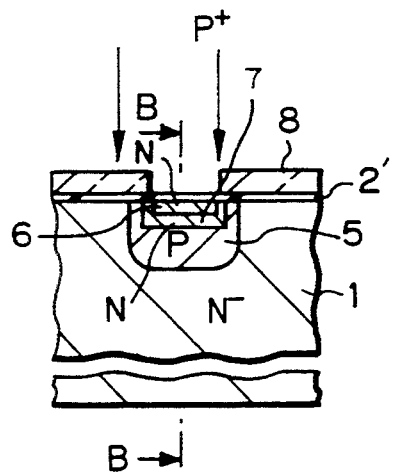
Figure 21B:
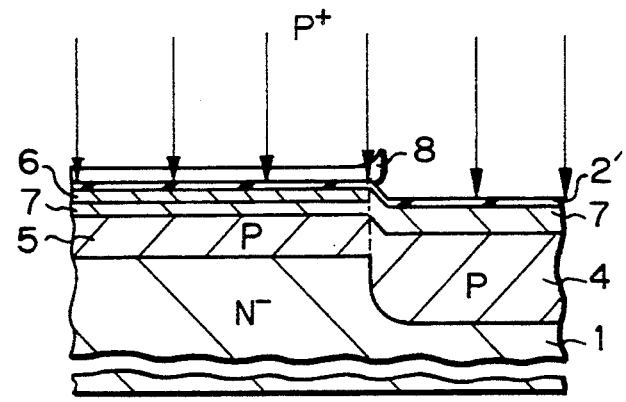

Next, as illustrated in FIGS. 21A and 21B, the silicon dioxide layer 2 and the thick silicon dioxide layer 9 are both removed by a wet etching process. Then, the silicon substrate 1 is again thermally oxidized to grow a silicon dioxide layer 2' having a thickness of about 20 nm. Then, $2.0 \times 10^{12}$ phosphorus ions (P$^+$) per square cm at 150 keV are implanted at the incident angle 0° with a mask of the patterned silicon nitride layer 8. In this state, an annealling (or heating) operation can be carried out as occasion demands. Thus, formed within the P-type wells 4 and 5 is an N-type impurity doped region 7 which serves as a part of the horizontal transfer portion and a part of the vertical transfer portion.

Then, the silicon nitride layer 8 is removed to obtain a BCCD type solid state image pickup device as illustrated in FIGS. 16A and 16B. Also, note that, when manufacturing an SCCD type solid image pickup device, the manufacturing steps for the N-type impurity doped regions 6 and 7 are unnecessary, in other words, the manufacturing steps after the formation of the P-type well 5 are unnecessary, and therefore, a SCCD type solid state image pickup device is obtained as illustrated in FIGS. 17A and 17B.

Thus, the CCD type solid state image pickup device of FIGS. 16A and 16B or FIGS. 17A and 17B is completed by forming electrodes and conductive layers for the photo/electro conversion portions, the charge transfer portion, and the light incident openings (see FIGS. 2 and 3).

In the above-mentioned second embodiment of the present invention, the silicon nitride layer 8 can serve as the photoresist layers 3c and 3d of the first embodiment, and therefore, the manufacturing steps can be reduced as compared with the first embodiment.

Next, a third embodiment of the method for manufacturing a CCD type solid state image pickup device according to the present invention will be explained with reference to FIGS. 22A, 22B, 23A, 23B, 24A, 24B, 25A, 25B, 26A, 26B, 27A and 27B, which correspond to FIGS. 12A, 12B, 13A, 13B, 14A, 14B, 15A, 15B, 16A, 16B, 17A and 17B, respectively.

Figure 22A:
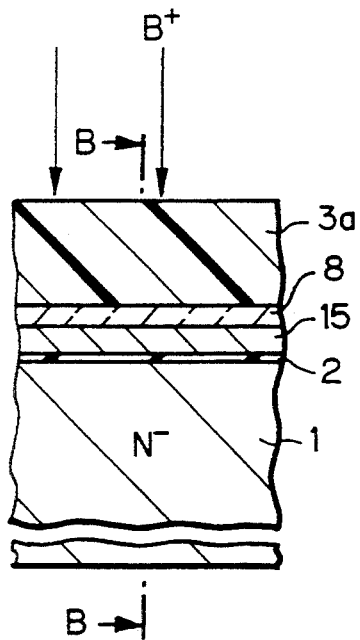
FIGS. 22A, 22B, 23A, 23B, 24A, 24B, 25A, 25B, 26A, 26B, 27A and 27B are cross-sectional views explaining a third embodiment of the method for manufacturing a CCD type solid state image pickup device according to the present invention.
Figure 22B:
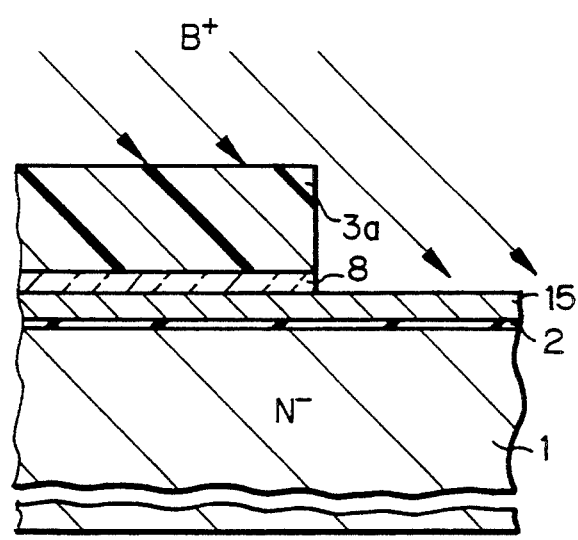

First, as illustrated in FIGS. 22A and 22B, a silicon dioxide layer 2 having a thickness of about 50 nm is formed by thermally growing a N$^-$-type monocrystalline silicon substrate 1. Then, a polycrystalline silicon layer 15 having a thickness of about 100 nm is formed by the CVD process, and a silicon nitride layer 8 having a thickness of about 150 nm is deposited by the CVD process on the polycrystalline silicon layer 15. Further, a photoresist layer 3a having a thickness of about 1.0 μm is coated thereon. Next, the photoresist layer 3a is patterned by conventional photolithography, and the silicon nitride layer 8 is patterned by a plasma etching process. Then, $1.0 \times 10^{12}$ boron ions (B$^+$) per square cm at 100 keV are implanted at the incident angle 60° with a mask of the patterned photoresist layer 3a and the silicon nitride layer 8. Then, the photoresist layer 3a is removed.

Figure 23A:
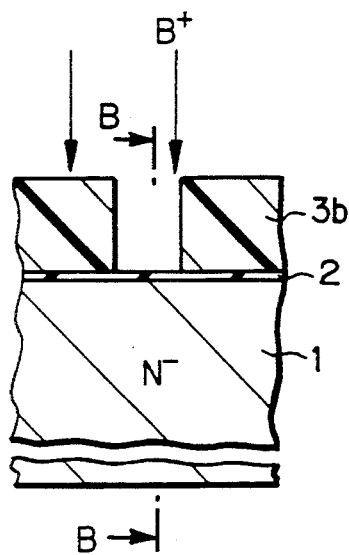
Figure 23B:
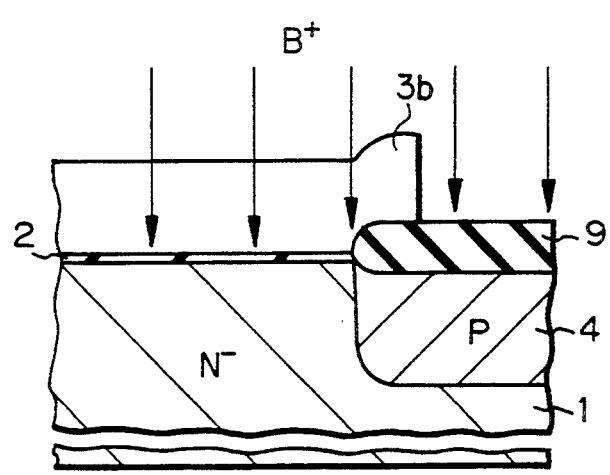

Next, as illustrated in FIG. 23A and 23B, a heating operation such as 1200° C.×5 hours is carried out to create a P-type well (impurity doped region) 4 within the silicon substrate 1. The P-type well 4 serves as a part of a horizontal transfer portion. Also, in this case, the inclination of the incident angle (such as 60°) of the boron ions is helpful in the adjustment of the P-type well configuration enlarged by this heat operation. Next, a selective oxidization is carried out with a mask of the patterned silicon nitride layer 8, to grow a thick silicon dioxide layer 9 having a thickness of about 400 nm on the P-type well 4. In this case, the thick silicon dioxide layer 9 is obtained by thermally growing the polycrystalline silicon layer 15 and the silicon substrate 1. As a result, the thick silicon dioxide layer 9 is located at a higher location than in the first and second embodiments (see FIG. 13B and FIG. 19B). Then, the silicon nitride layer 8 and the noxidized polycrystalline silicon layer 15 are removed by a wet etching process. Again a photoresist layer 3b having a thickness of about 1.0 μm is coated thereon, and is patterned by conventional photolithography. In this case, note that the patterned photoresist layer 3b does not cover the horizontal transfer portion and the vertical transfer portion. Then, $3.0 \times 10^{12}$ boron ions (B+) per square cm at 60 keV are implanted at the incident angle 0° with a mask of the patterned photoresist layer 3b. Then, the photoresist layer 3b is removed.

Figure 24A:
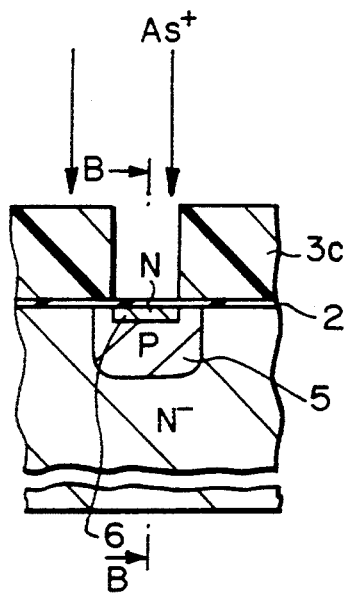
Figure 24B:
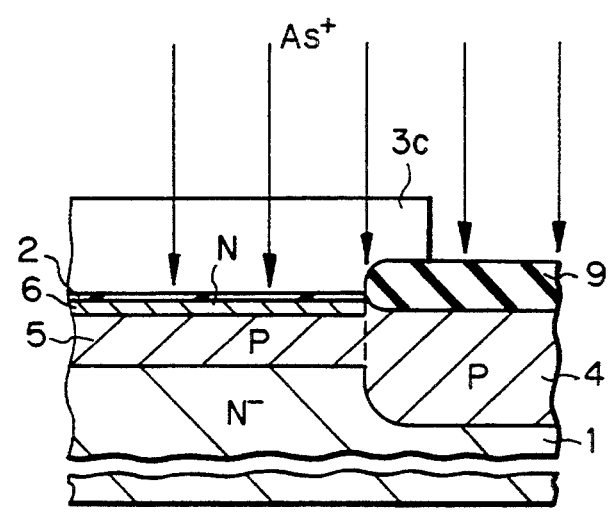

Next, as illustrated in FIGS. 24A and 24B, a heating operation such as 1100° C.×2 hours is carried out to create a P-type well (impurity doped region) 5 within the silicon substrate 1. The P-type well 5 serves as a part of a vertical transfer portion. Thus, the P-type well 5 for the vertical transfer portion is in self-alignment with the P-type well 4 for the horizontal transfer portion. Then, a photoresist layer 3c having a thickness of about 1.0 μm is coated thereon, and is patterned by conventional photolithography. Also, in this case, the patterned photoresist layer 3c does not cover the horizontal transfer portion and the vertical transfer portion. Then, $2.0 \times 10^{12}$ arsenic ions ($A_s$+) per square cm at 150 keV are implanted at the incident angle 0° with a mask of the patterned photoresist layer 3c and the thick silicon dioxide layer 9. In this state, an annealling (or heating) operation can be carried out as occasion demands. Thus, formed within the P-type wells 5 is an N-type impurity doped region 6 which serves as a part of the vertical transfer portion. In this case, the N-type impurity doped region 6 is in self-alignment with the P-type well 5 for the vertical transfer portion and the P-type well 4 for the horizontal transfer portion.

Figure 25A:
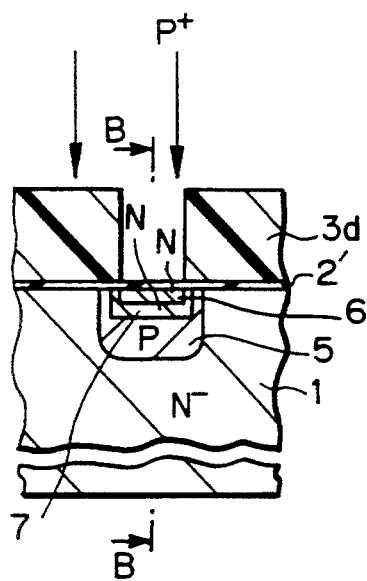
Figure 25B:
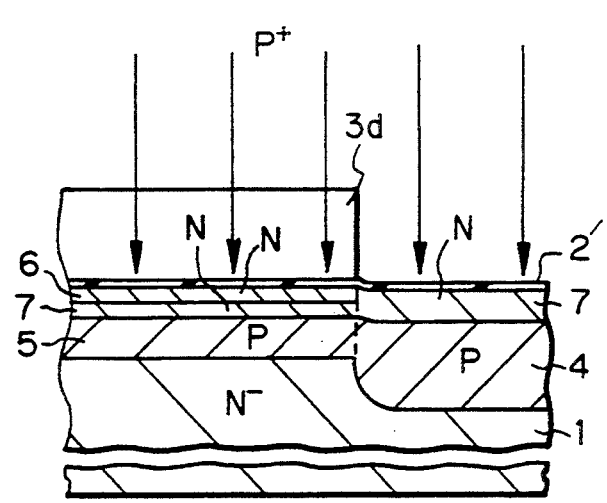

Next, as illustrated in FIGS. 25A and 25B, the silicon dioxide layer 2 and the thick silicon dioxide layer 9 are both removed by a wet etching process. Then, the silicon substrate 1 is again thermally oxidized to grow a silicon dioxide layer 2' having a thickness of about 20 nm. Again, a photoresist layer 3d having a thickness of about 1.0 μm is coated thereon, and is patterned by conventional photolithography. Also, in this case, the patterned photoresist layer 3d does not cover the horizontal transfer portion and the vertical transfer portion. Then, $2.0 \times 10^{12}$ phosphorus ions (P+) per square cm at 150 keV are implanted at the incident angle 0° with a mask of the patterned photoresist layer 3d. In this state, an anneal (or heat) operation can be carried out as occasion demands. Thus, formed within the P-type wells 4 and 5 is an N-type impurity doped region 7 which serves as a part of the horizontal transfer portion and a part of the vertical transfer portion.

Figure 26A:
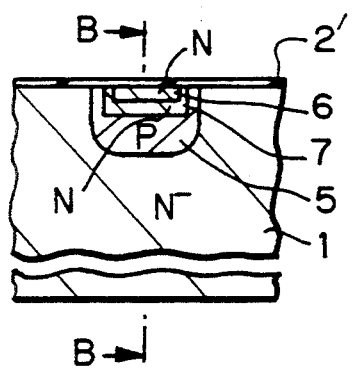
Figure 26B:
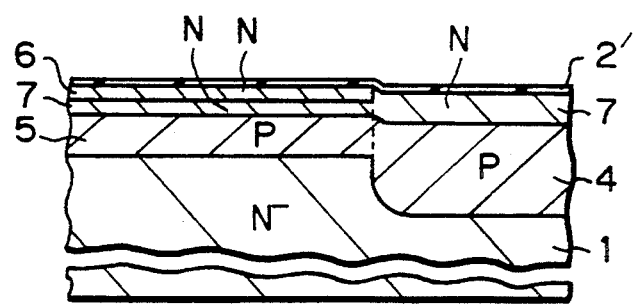
Figure 27A:
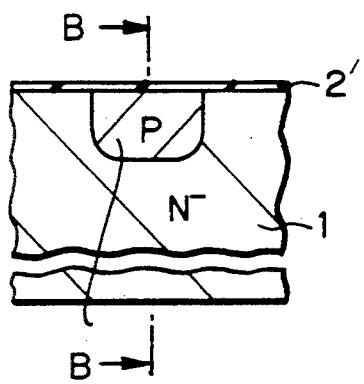
Figure 27B:
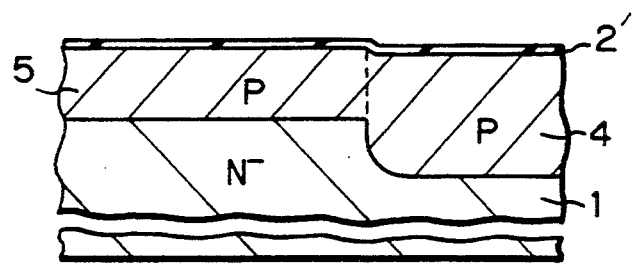

Then, the photoresist layer 3d is removed to obtain a BCCD type solid state image pickup device as illustrated in FIGS. 26A and 26B. Also, note that, when manufacturing an SCCD type solid state image pickup device, the manufacturing steps for the N-type impurity doped regions 6 and 7 are unnecessary, in other words, the manufacturing steps after the formation of the P-type well 5 are unnecessary, and therefore, a SCCD type solid state image pickup device is obtained as illustrated in FIGS. 27A and 27B.

Thus, the CCD type solid state image pickup device of FIGS. 26A and 26B or FIGS. 27A and 27B is completed by forming electrodes and conductive layers for the photo/electro conversion portions, the charge transfer portion, and the light incident openings (see FIGS. 2 and 3).

In the above-mentioned mentioned third embodiment of the present invention, the height of a step in the surface of the silicon substrate generated at the border of the vertical transfer portion and the horizontal transfer portion can be reduced as compared with the first and second embodiments, thus further effectively enabling a transfer of signal charges from the vertical transfer portion to the horizontal transfer portion.

Next, a fourth embodiment of the method for manufacturing a CCD type solid state image pickup device according to the present invention will be explained with reference to FIGS. 28A, 28B, 29A, 29B, 30A, 30B, 31A, 31B, 32A, 32B, 33A and 33B, which correspond to FIGS. 12A, 12B, 13A, 13B, 14A, 14B, 15A, 15B, 16A, 16B, 17A and 17B, respectively.

Figure 28A:
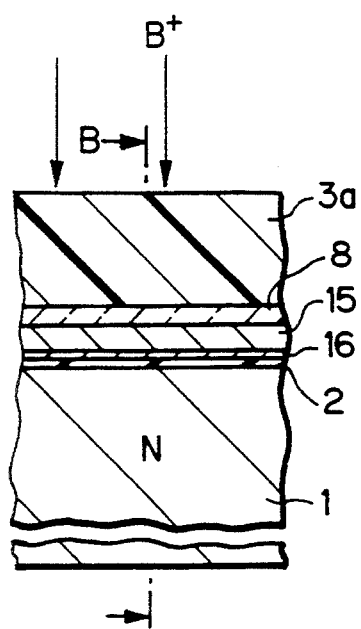
FIGS. 28A, 28B, 29A, 29B, 30A, 30B, 31A, 31B, 32A, 32B, 33A, and 33B, are cross-sectional views explaining a fourth embodiment of the method for manufacturing a CCD type solid state image pickup device according to the present invention.
Figure 28B:
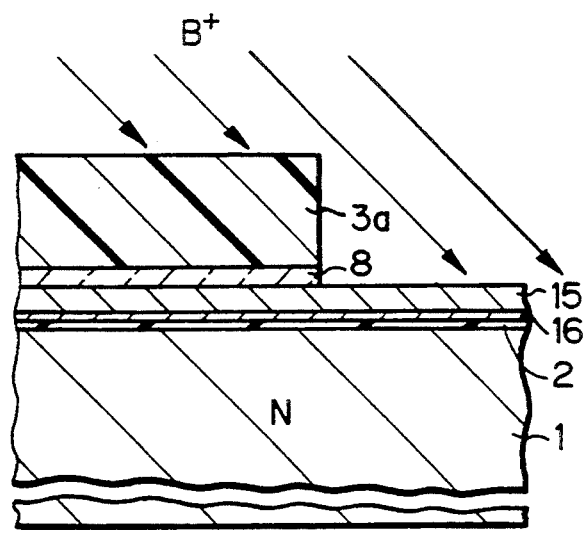

First, as illustrated in FIGS. 28A and 28B, a silicon dioxide layer 2 having a thickness of about 20 nm is formed by thermally growing an N−-type monocrystalline silicon substrate 1. Then, a silicon nitride layer 16 having a thickness of about 20 nm, a polycrystalline silicon layer 15 having a thickness of about 100 nm, and a thick silicon nitride layer 8 having a thickness of about 150 nm are deposited by the CVD process on the silicon dioxide layer 2. Further, a photoresist layer 3a having a thickness of about 1.0 μm is coated thereon. Next, the photoresist layer 3a is patterned by conventional photolithography, and the silicon nitride layer 8 is patterned by a plasma etching process. Then, $1.0 \times 10^{12}$ boron ions (B+) per square cm at 100 keV are implanted at the incident angle 60° with a mask of the patterned photoresist layer 3a and the silicon nitride layer 8. Then, the photoresist layer 3a is removed.

Figure 29A:
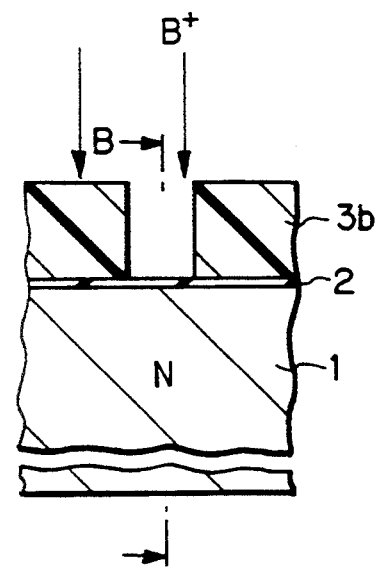
Figure 29B:
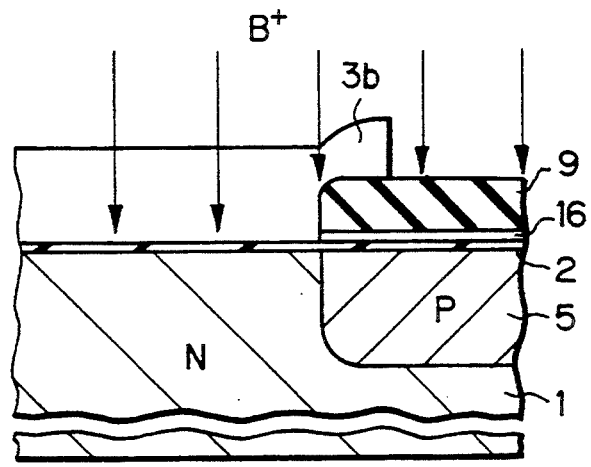

Next, as illustrated in FIG. 29A and 29B, a heat operation such as 1200° C.×5 hours is carried out to create a P-type well (impurity doped region) 4 within the silicon substrate 1. The P-type well 4 serves as a part of a horizontal transfer portion. Also, in this case, that the inclination of the incident angle (such as 60°) of the boron ions is helpful in the adjustment of the P-type well configuration enlarged by this heat operation. Next, a selective oxidization is carried out with a mask of the patterned silicon nitride layer 8, to grow a thick silicon dioxide layer 9 having a thickness of about 400 nm on the P-type well 4. In this case, the thick silicon dioxide layer 9 is obtained by thermally growing only the polycrystalline silicon layer 15. As a result, the thick silicon dioxide layer 9 is located at a higher location than in the first, second and third embodiments (see FIGS. 13B, 19B and 23B). Then, the silicon nitride layer 8, the unoxidized polycrystalline silicon layer 15 and the silicon nitride layer 16 are removed by the wet etching process. Again, a photoresist layer 3b having a thickness of about 1.0 μm is coated thereon, and is patterned by conventional photolithography. In this case, note that the patterned photoresist layer 3b does not cover the horizontal transfer portion and the vertical transfer portion. Then, $3.0 \times 10^{12}$ boron ions (B+) per square cm at 60 keV are implanted at the incident angle 0° with a mask of the patterned photoresist layer 3b. Then, the photoresist layer 3b is removed.

Figure 30A:
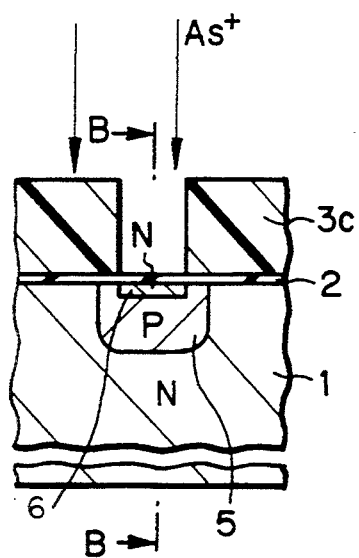
Figure 30B:
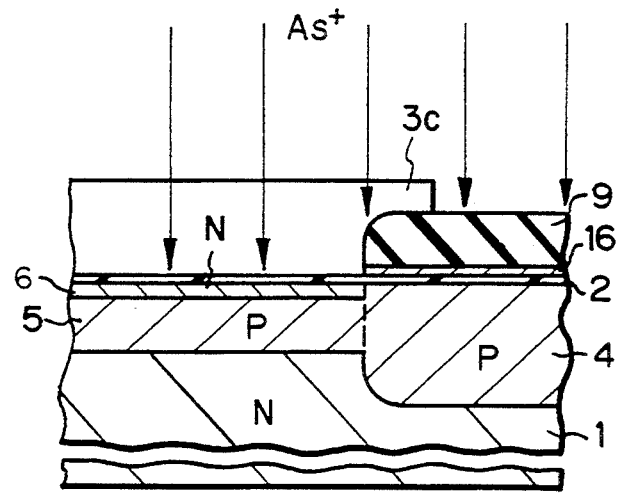

Next, as illustrated in FIG. 30A and 30B, a heating operation such as 1100° C.×2 hours is carried out to create a P-type well (impurity doped region) 5 within the silicon substrate 1. The P-type well 5 serves as a part of the vertical transfer portion. Thus, the P-type well 5 for the vertical transfer portion is in self-alignment with the P-type well 4 for the horizontal transfer portion. Then, a photoresist layer 3c having a thickness of about 1.0 μm is coated thereon, and is patterned by conventional photolithography. Also, in this case, the patterned photoresist layer 3c does not cover the horizontal transfer portion and the vertical transfer portion.

Then, $2.0 \times 10^{12}$ arsenic ions ($A_s^+$) per square cm at 150 keV are implanted at the incident angle 0° with a mask of the patterned photoresist layer 3c and the thick silicon dioxide layer 9. Then, the photoresist layer 3c is removed. In this state, an annealling (or heating) operation can be carried out as occasion demands. Thus, formed within the P-type wells 5 is an N-type impurity doped region 6 which serves as a part of the horizontal transfer portion. In this case, the N-type impurity doped region 6 is in self-alignment with the P-type well 5 for the vertical transfer portion and the P-type well 4 for the horizontal transfer portion.

Figure 31A:
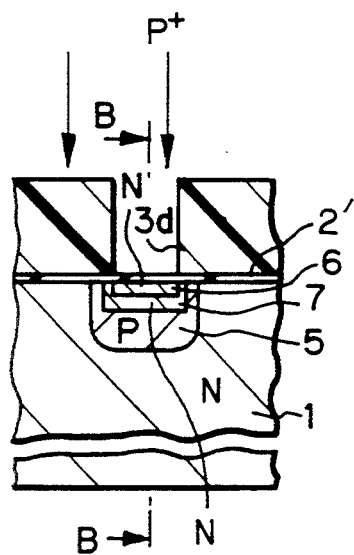
Figure 31B:
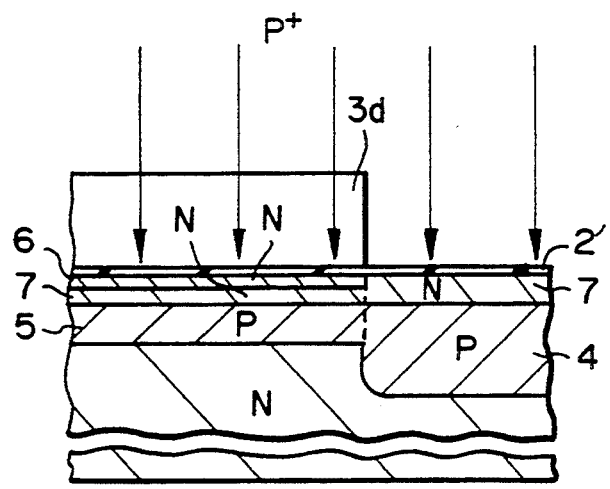

Next, as illustrated in FIGS. 31A and 31B, the silicon dioxide layer 2 and the thick silicon dioxide layer 9 are both removed by a wet etching process. Then, the silicon substrate 1 is again thermally oxidized to grow a silicon dioxide layer 2' having a thickness of about 20 nm. Again, a photoresist layer 3d having a thickness of about 1.0 μm is coated thereon, and is patterned by conventional photolithography. Also, in this case, the patterned photoresist layer 3d does not cover the horizontal transfer portion and the vertical transfer portion. Then, $2.0 \times 10^{12}$ phosphorus ions ($P^+$) per square cm at 150 keV are implanted at the incident angle 0° with a mask of the patterned photoresist layer 3d. In this state, an annealling (or heating) operation can be carried out as occasion demands. Thus, formed within the P-type wells 4 and 5 is an N-type impurity doped region 7 which serves as a part of the horizontal transfer portion and a part of the vertical transfer portion.

Figure 32A:
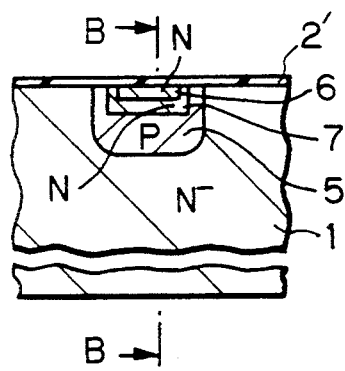
Figure 32B:
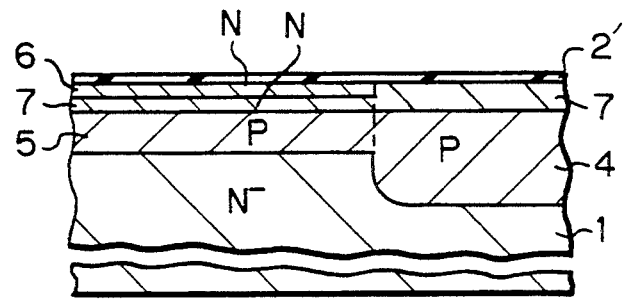
Figure 33A:
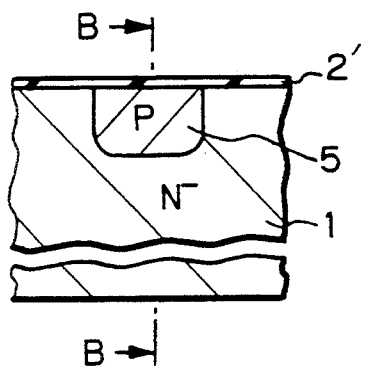
Figure 33B:
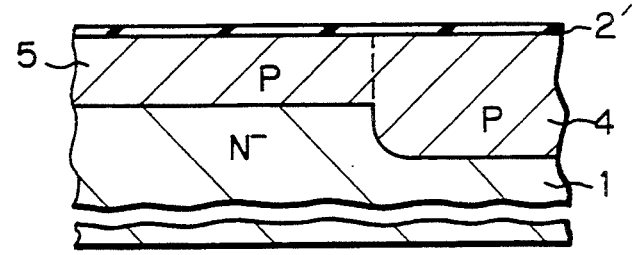

Then, the photoresist layer 3d is removed to obtain a BCCD type solid state image pickup device as illustrated in FIGS. 32A and 32B. Also, note that, when manufacturing an SCCD type solid state image pickup device, the manufacturing steps for the N-type impurity doped regions 6 and 7 are unnecessary, in other words, the manufacturing steps after the formation of the P-type well 5 are unnecessary, and therefore, a SCCD type solid state image pickup device is obtained as illustrated in FIGS. 33A and 33B.

Thus, the CCD type solid state image pickup device of FIGS. 32A and 32B or FIGS. 33A and 33B are completed by forming electrodes and conductive layers for the photo/electro conversion portions, the charge transfer portion, and the light incident openings (see FIG. 2 and 3).

In the above-mentioned fourth embodiment of the present invention, no step in the surface of the silicon substrate generated at the border of the vertical transfer portion and the horizontal transfer portion need be provided, thus further effectively enabling a transfer of signal charges from the vertical transfer portion to the horizontal transfer portion as compared with the first, second and third embodiments.

As explained hereinbefore, according to the present invention, since the vertical transfer portion and the horizontal transfer portion are in self-alignment with each other, the potential well and potential barrier generated by the misalignment can be avoided, thus effectively enabling a transfer of signal charges from the vertical transfer portion to the horizontal transfer portion.

I claim:

1. A method for manufacturing a CCD type solid state image pickup device having at least one vertical transfer portion and a horizontal transfer portion connected to said at least one vertical transfer portion, comprising the steps of:

forming a first mask pattern layer on a semiconductor substrate of a first conductivity type, said first mask pattern layer being formed on said at least one vertical transfer portion;

introducing first impurities of a second conductivity type opposite to said first conductivity type into said semiconductor substrate with said first mask pattern layer, to generate a first impurity doped region for said horizontal transfer portion;

forming a second mask pattern layer on said horizontal transfer portion in self-alignment with said first mask pattern layer;

removing said first mask pattern layer; and introducing second impurities of said second conductivity type into said semiconductor substrate with said second mask pattern layer, to generate a second impurity doped region for said at least one vertical transfer portion.

2. A method as set forth in claim 1, further comprising the steps of:

introducing third impurities of said first conductivity type into said semiconductor substrate with said second mask pattern layer, to generate a third impurity doped region within said second impurity doped region;

removing said second mask pattern layer; and introducing fourth impurities of said first conductivity type into said semiconductor substrate to generate a fourth impurity doped region within said first and second impurity doped regions.

3. A method as set forth in claim 1, wherein said first mask pattern layer forming step comprises the steps of:

forming a silicon dioxide layer on said semiconductor substrate;

forming a silicon nitride layer on said dioxide layer;

forming a photoresist layer on said silicon nitride layer; and patterning said photoresist layer and said silicon nitride layer with a mask of said photoresist layer, to thereby form said first mask pattern layer.

4. A method as set forth in claim 3, wherein said second mask pattern layer forming step comprises the steps of:

removing said photoresist layer; and thermally oxidizing said semiconductor substrate with a mask of said silicon nitride layer to generate said second mask pattern layer.

5. A method as set forth in claim 4, wherein said first mask pattern removing step further comprises a step of removing said silicon nitride layer.

6. A method as set forth in claim 1, wherein said first mask pattern layer forming step comprises the steps of:

forming a silicon dioxide layer on said semiconductor substrate;

forming a polycrystalline silicon layer on said silicon dioxide layer;

forming a silicon nitride layer on said polycrystalline silicon layer;

forming a photoresist layer on said silicon nitride layer; and patterning said photoresist layer and said silicon nitride layer with a mask of said photoresist layer, to thereby form said first mask pattern layer.

7. A method as set forth in claim 6, wherein said second mask pattern layer forming step comprises the steps of:

removing said photoresist layer; and thermally oxidizing said polycrystalline layer and said semiconductor substrate to generate said second mask pattern layer.

8. A method as set forth in claim 7, wherein said first mask pattern removing step further comprises a step of removing said silicon nitride layer and said polycrystalline silicon layer.

9. A method as set forth in claim 1, wherein said first mask pattern layer forming step comprises the steps of:
forming a silicon dioxide layer on said semiconductor substrate;
forming a first silicon nitride layer on said silicon dioxide layer;
forming a polycrystalline silicon layer on said first silicon nitride layer;
forming a second silicon nitride layer on said polycrystalline silicon layer;
forming a photoresist layer on said second silicon nitride layer; and
patterning said photoresist layer and said second silicon nitride layer with a mask of said photoresist layer, to thereby form said first mask pattern layer.

10. A method as set forth in claim 9, wherein said second mask pattern layer forming step comprises the steps of:
removing said photoresist layer; and
thermally oxidizing said polycrystalline layer to generate said second mask pattern layer.

11. A method as set forth in claim 10, wherein said first mask pattern removing step further comprises a step of removing said second silicon nitride layer, said polycrystalline silicon layer and said first silicon nitride layer.

12. A method as set forth in claim 1, wherein said impurity introducing step for said horizontal transfer portion comprises a step of ion-implanting impurities of said second conductivity type by changing an incident angle of impurities.

13. A method for manufacturing a CCD type solid image pickup device comprising the steps of:
forming a first silicon dioxide layer on a semiconductor substrate of a first conductivity type;
forming a silicon nitride layer thereon;
forming a first photoresist layer thereon;
patterning said first photoresist layer;
etching out said silicon nitride layer with a mask of said first photoresist layer;
doping first impurities of a second conductivity type opposite to said first conductivity type into said semiconductor substrate with a mask of said first photoresist layer and said silicon nitride layer;
removing said first photoresist layer;
carrying out a first heating operation to form a first impurity doped region for a horizontal transfer portion;
thermally growing a second silicon dioxide layer on said semiconductor substrate in self-alignment with a mask of said silicon nitride layer;
removing said silicon nitride layer;
forming a second photoresist layer thereon;
patterning said second photoresist layer;
doping second impurities of said second conductivity type into said semiconductor substrate with a mask of said second silicon oxide layer and said second photoresist layer;
removing said second photoresist layer; and
carrying out a second heating operation to form a second impurity doped region for said vertical transfer portion.

14. A method as set forth in claim 13, further comprising the steps of:
forming a third photoresist layer thereon;
patterning said third photoresist layer to remove a portion thereof on said second impurity doped region;
doping third impurities of said first conductivity type into said semiconductor substrate with a mask of said second silicon oxide layer and said third photoresist layer, to thereby form a third impurity doped region for said vertical transfer portion;
removing said third photoresist layer and said second silicon dioxide layer;
forming a fourth photoresist layer thereon;
patterning said fourth photoresist layer so as not to cover said horizontal transfer portion and said vertical transfer portion; and
doping fourth impurities of said first conductivity type into said semiconductor substrate with a mask of said fourth photoresist layer, to thereby form a fourth impurity doped region for said vertical transfer portion and said horizontal transfer portion.

15. A method as set forth in claim 13, wherein said step of doping said first impurities comprises ion-implanting impurities of said second conductivity type by changing the incident angle of impurities.

16. A method for manufacturing a CCD type solid image pickup device, comprising the steps of:
forming a first silicon dioxide layer on a semiconductor substrate of a first conductivity type;
forming a silicon nitride layer thereon;
forming a first photoresist layer thereon;
patterning said first photoresist layer;
etching out said silicon nitride layer with a first mask of said first photoresist layer;
doping first impurities of a second conductivity type opposite to said first conductivity type into said semiconductor substrate with a second mask formed by said first photoresist layer and said silicon nitride layer;
removing said first photoresist layer;
carrying out a first heating operation to form a first impurity doped region for a horizontal transfer portion;
thermally growing a second silicon dioxide layer on said semiconductor substrate in self-alignment with a third mask of said silicon nitride layer;
forming a second photoresist layer thereon;
patterning said second photoresist layer;
selectively removing said silicon nitride layer with a fourth mask of said second photoresist layer;
doping second impurities of said second conductivity type into said semiconductor substrate with a fifth mask formed by said silicon nitride layer, said second silicon oxide layer and said second photoresist layer;
removing said second photoresist layer; and
carrying out a second heating operation to form a second impurity doped region for a vertical transfer portion.

17. A method as set forth in claim 16, further comprising the steps of:
forming a third photoresist layer;

patterning said third photoresist layer to remove a part thereof on said second impurity doped region;

doping third impurities of said first conductivity type into said semiconductor substrate with a sixth mask formed by said silicon nitride layer, said second silicon oxide layer and said third photoresist layer, to thereby form a third impurity doped region for said vertical transfer portion; and doping fourth impurities of said first conductivity type into said semiconductor substrate with said third mask of said silicon nitride layer to thereby form a fourth impurity doped region for said vertical transfer portion and said horizontal transfer portion.

18. A method as set forth in claim 16, wherein said step of doping said first impurities comprises ion-implanting impurities of said second conductivity type by changing the incident angle of impurities.

19. A method for manufacturing a CCD type solid image pickup device, comprising the steps of:

forming a first silicon dioxide layer on a semiconductor substrate of a first conductivity type;

forming a polycrystalline silicon layer thereon;

forming a silicon nitride layer thereon;

forming a first photoresist layer thereon;

patterning said first photoresist layer;

etching out said silicon nitride layer with a mask of said first photoresist layer;

doping first impurities of a second conductivity type opposite to said first conductivity type into said semiconductor substrate with a first mask formed by said first photoresist layer and said silicon nitride layer;

removing said first photoresist layer;

carrying out a first heating operation to form a first impurity doped region for a horizontal transfer portion;

thermally growing a second silicon dioxide layer on said polycrystalline silicon layer and said semiconductor substrate in self-alignment with a second mask of said silicon nitride layer;

removing said silicon nitride layer and said polycrystalline silicon layer;

forming a second photoresist layer thereon;

patterning said second photoresist layer;

doping second impurities of said second conductivity type into said semiconductor substrate with a third mask formed by said second silicon dioxide layer and said second photoresist layer;

removing said second photoresist layer; and carrying out a second heating operation to form a second impurity doped region for a vertical transfer portion.

20. A method as set forth in claim 19, further comprising the steps of:

forming a third photoresist layer;

patterning said third photoresist layer to remove a part thereof on said second impurity doped region;

doping third impurities of said first conductivity type into said semiconductor substrate with a mask of said second silicon dioxide layer and said third photoresist layer, to thereby form a third impurity doped region for said vertical transfer portion;

removing said third photoresist layer and said second silicon dioxide layer;

forming a fourth photoresist layer thereon;

patterning said fourth photoresist layer so as not to cover said horizontal transfer portion and said vertical transfer portion;

doping fourth impurities of said first conductivity type into said semiconductor substrate with a mask of said fourth photoresist layer, to thereby form a fourth impurity doped region for said vertical transfer portion and said horizontal transfer portion.

21. A method as set forth in claim 19, wherein said step of doping said first impurities comprises ion-implanting impurities of said second conductivity type by changing the incident angle of impurities.

22. A method for manufacturing a CCD type solid state image pickup device, comprising the steps of:

forming a first silicon dioxide layer on a semiconductor substrate of a first conductivity type;

forming a first silicon nitride layer thereon;

forming a polycrystalline silicon layer thereon;

forming a second silicon nitride layer thereon;

forming a first photoresist layer thereon;

patterning said first photoresist layer;

etching out said second silicon nitride layer with a first mask of said first photoresist layer;

doping first impurities of a second conductivity type opposite to said first conductivity type into said semiconductor substrate with a second mask formed by said first photoresist layer and said second silicon nitride layer;

removing said first photoresist layer;

carrying out a first heating operation to form a first impurity doped region for a horizontal transfer portion;

thermally growing a second silicon dioxide layer on said polycrystalline silicon layer in self-alignment with a third mask of said first silicon nitride layer;

selectively removing said second silicon nitride layer, said polycrystalline silicon layer and said first silicon nitride layer with a fourth mask of said second silicon dioxide layer;

forming a second photoresist layer thereon;

patterning said second photoresist layer so as not to cover said horizontal transfer portion and a vertical transfer portion;

doping second impurities of said second conductivity type into said semiconductor substrate with a fifth mask formed by said second silicon dioxide layer and said second photoresist layer;

removing said second photoresist layer; and carrying out a second heating operation to form a second impurity doped region for said vertical transfer portion.

23. A method as set forth in claim 22, further comprising the steps of:

forming a third photoresist layer;

patterning said third photoresist layer to remove a part thereof on said second impurity doped region;

doping impurities of said first conductivity type into said semiconductor substrate with a sixth mask formed by said second silicon dioxide layer, said first silicon nitride layer, said first silicon dioxide layer and said third photoresist layer, to thereby form a third impurity doped region for said vertical transfer portion;

removing said third photoresist layer, said second silicon dioxide layer, said first silicon nitride layer and said first silicon dioxide layer;

forming a fourth photoresist layer thereon;

patterning said fourth photoresist layer not to cover said horizontal transfer portion and said vertical transfer portion;

doping impurities of said first conductivity type into said semiconductor substrate with a seventh mask formed by said fourth photoresist layer, to thereby form a fourth impurity doped region for said vertical transfer portion and said horizontal transfer portion.

24. A method as set forth in claim 22, wherein said step of doping said first impurities comprises ion-implanting impurities of said second conductivity type by changing the incident angle of impurities.

* * * * *

UNITED STATES PATENT AND TRADEMARK OFFICE
CERTIFICATE OF CORRECTION

PATENT NO.   : 5,441,910
DATED        : August 15, 1995
INVENTOR(S)  : Yasutaka NAKASHIBA It is certified that error(s) appears in the above-identified patent and that said Letters Patent is hereby corrected as shown below:

Col. 8, line 65, delete "noxidized" and insert --unoxidized--.

Col. 13, line 36, delete "introducing" and insert --doping--.

Col. 13, line 37, after "ion-implanting and insert --said first--.

Signed and Sealed this

Thirtieth Day of April, 1996

Attest:

BRUCE LEHMAN

*Attesting Officer*     *Commissioner of Patents and Trademarks*